United States Patent [19]
Higashi et al.

[11] Patent Number: 4,877,719
[45] Date of Patent: Oct. 31, 1989

[54] PROCESS FOR PREPARING IMAGE-BEARING PLATES

[75] Inventors: Tatsuji Higashi; Nobuyuki Kita, both of Shizuoka, Japan

[73] Assignee: Fuji Photo Film Co., Ltd., Minami-ashigara, Japan

[21] Appl. No.: 918,126

[22] Filed: Oct. 14, 1986

[30] Foreign Application Priority Data

Oct. 18, 1985 [JP] Japan .................... 60-232470

[51] Int. Cl.⁴ .................................. G03C 5/16
[52] U.S. Cl. .................... 430/326; 430/331; 430/330; 430/309; 430/270
[58] Field of Search ............... 430/326, 331, 330, 309

[56] References Cited

U.S. PATENT DOCUMENTS 4,506,006 3/1985 Ruckert ................. 430/269 X

OTHER PUBLICATIONS

A. A. Arcus and J. E. Doughty, "Positive Resist Development Process for Metal Etch", *IBM Technical Disclosure Bulletin*, vol. 15, No. 11, Apr. 1973, p. 3537.
Hiroshi Ito and Grant Willson, "Applications of Photoinitiators to the Design of Resists for Semiconductor Manufacturing", from *Polymers in Electronics*, edited by Theodore Davidson, ACS Symposium Series 242 based on Symposium by Division of Organic Coating and Plastics Chemistry at 185th Meeting of ACS. Seattle, Washington, Mar. 20-25, 1983, American Chemical Society, USA, 1984, pp. 11-23.
Donald Johnson, "Thermolysis of Positive Photoresists", *SPIE*, vol. 469, Advances in Resist Technology (1984), pp. 72-79.

Primary Examiner—Paul R. Michl
Assistant Examiner—Cynthia Hamilton
Attorney, Agent, or Firm—Burns, Doane, Swecker & Mathis

[57] ABSTRACT

Disclosed is a process for preparing an image-bearing plate for use in a lithographic printing plate, a photoresist or the like. The process comprises, after imagewise exposing a light-sensitive plate comprising a support having provided thereon a light-sensitive layer comprising a compound capable of producing an acid upon irradiation with actinic rays, a compound having at least one acid-decomposable group, and an alkali-soluble resin, treating the exposed plate with hot water of at least 25° C. for a period of at least 10 seconds, prior to development. It is possible to achieve high sensitivity regardless of the interval between the exposure and the development.

9 Claims, No Drawings

PROCESS FOR PREPARING IMAGE-BEARING PLATES

BACKGROUND OF THE INVENTION

(1) Field of the Invention

The present invention relates to a process for preparing an image-bearing plate, and particularly to a process suitable for use in preparing lithographic printing plates, color proofing sheets, picture plates for overhead projecters, integral circuits, photomasks or the like.

(2) Description of the Prior Art

In preparing a lithographic printing plate, photoresist or the like, there has been widely used an O-quinone diazide compound as a positive working light-sensitive substance. Such O-quinone diazide compounds are described in a number of publications including U.S. Pat. Nos. 2,766,118 and 2,767,092.

An O-quinone diazide compound decomposes, upon irradiation with actinic rays, to produce a carboxylic acid having a five-membered ring, to thereby become alkali-soluble so that they have been used as a light-sensitive substance. However, they have a drawback in that the light-sensitivity is insufficient. The drawback comes from the fact that, when an O-quinone diazide compound is irradiated with actinic rays, the quantum efficiency does not exceed one.

There have been proposed a variety of methods for increasing the light-sensitivity of compositions containing O-quinone diazide compounds, for example, as described in U.S. Pat. Nos. 3,661,582; 4,009,003, and 4,307,173. However, it is found that even by such methods the light-sensitivity is increased only two or three times higher than the conventional composition containing O-quinone diazide compounds.

It has also been proposed to use, as a positive working light-sensitive substance, compounds other than O-quinone diazide compounds. For example, in U.S. Pat. No. 3,849,137 there is proposed the use of polymeric compounds having ortho-nitrocarbinol ester groups. However, the light-sensitivity of such compound is not satisfactory, for the same reasons as in O-quinone diazide compounds.

Another approach to obtain an increased light-sensitivity is utilization of a compound capable of producing an acid through photolysis, in which the acid produced by the photolysis causes a second reaction leading to the solubilization of the exposed area. Thus, there have been proposed various light-sensitive systems comprising such compound capable of producing an acid by photolysis in combination with, for example, an acetal or ortho-N-acetal compound as in U.S. Pat. No. 3,779,778; an orthoester or amidacetal compound as in U.S. Pat. No. 4,101,323; a polymeric compound having acetal or ketal groups at the main chain thereof as in U.S. Pat. No. 4,247,611; an enolether compound as in U.S. Pat. No. 4,248,957; N-acyl iminocarbonate compound as in U.S. Pat. No. 4,250,247; or a polymeric compound having orthoester groups at the main chain thereof as in Japanese patent application (OPI) No. 17345/1981. The term "OPI" used herein means a published unexamined application. These systems exhibit higher light-sensitivity since the photoreaction will theoretically take place with a quantum efficiency exceeding one.

However, the use of a light-sensitive composition comprising such compound capable of producing an acid through photolysis is disadvantageous in that it results in a troublesome problem which is known as "latent-image sensitization". More specifically, the decomposition reaction for solubilizing the exposed area will progressively take place, due to the acid produced, even after the exposure so that it will take as long as one hour or more before attaining of a desired steady sensitivity. That is, the longer the interval between the exposure and the development, the higher the sensitivity becomes. Thus, there is observed a remarkable difference in sensitivity between a case where a light-sensitive plate is developed immediately after the imagewise exposure and a case where a number of light-sensitive plates are successively imagewise exposed and stacked, and then, after certain periods of time, subjected to a development operation.

There has also been proposed a process for increasing the sensitivity of such light-sensitive plates through heating before, during and/or after the exposure, for example, by contacting the plate with a heated roll, by hot air or irradiation with infrared rays, as described in Japanese patent applications (OPI) Nos. 114031/1983 and 119343/1982. It is, however, difficult, by such methods, to constantly obtain a desired steady sensitivity.

SUMMARY OF THE INVENTION

It is therefore an object of the present invention to provide a novel process for preparing an image-bearing plate, which overcomes the above-mentioned disadvantages.

After extensive studies it has been found by the present inventors that the object can be accomplished by treating a light-sensitive plate, after the exposure, with hot water.

Thus, according to the present invention, there is provided a process for preparing an image-bearing plate which comprises the steps of imagewise exposing a light-sensitive plate comprising a substrate having provided thereon a light-sensitive layer comprising (a) 0.01 to 10% by weight of a compound capable of producing an acid upon radiation with actinic rays, (b) 10 to 40% by weight of a compound having at least one acid-decomposable group, wherein the product formed by the reaction between said acid and the compound has a solubility, in a developing solution, higher than that of said compound having the acid-decomposable group, and (c) 60 to 90% by weight of an alkali-soluble resin; then treating the exposed plate with hot water of 25° C. or higher for a period of at least 10 seconds, and removing the non-image area with an aqueous alkali solution from the plate.

The light-sensitive layer is generally provided in the range of 0.1 g/m$^2$ to 5 g/m$^2$ after drying.

The present invention is characterized in that an exposed plate is treated with hot water, prior to development. The hot-water treatment is preferably carried out as soon as possible after exposure, most preferably within about one hour after the exposure. The temperature of hot water is at least 25° C., preferably 30° to 50° C. Hot water exceeding 60° C. is not preferred. The hot-water treatment is conducted for a period of at least 10 seconds, preferably 30 to 120 seconds. The shorter the interval between the exposure and the hot-water treatment, the shorter the period of time for the hot-water treatment.

As a suitable compound (a) to be used in the present invention, which is capable of producing an acid upon irradiation with actinic rays, there can be exemplified a number of known compounds and the mixtures thereof, including salts of diazonium, phosphonium, sulfonium or iodonium with $BF_4^-$, $PF_6^-$, $SbF_6^-$, $SiF_6^{--}$, $ClO_4^-$ or the like; organic-halide compounds; orthoquinone diazide sulfonyl chlorides; and combinations of organic-metallic compounds/organic-halide compounds. As the component (a) of the light-sensitive plate in the present invention, there are also suitable such compounds capable of producing an acid by photolysis as described in U.S. Pat. No. 3,779,778 and German Pat. No. 2,610,842.

Of these compounds, which are capable of producing an acid through photolysis, particularly suitable are tri-halomethyl compounds such as tri-halomethyl-S-triazine compounds and tri-halomethyloxadiazole compounds.

Such a compound capable of producing an acid upon irradiation with actinic rays is added in an amount of 0.01 to 10%, preferably 0.1 to 2% by weight of the total composition.

As a compound (b) having at least one acid-decomposable group wherein the product formed by the reaction between the acid and the compound has a solubility higher than that of said compound in a developing solution, there can be included, as detailed later, silylether group-containing compounds; acetal or ketal group-containing compounds; enolether group-containing compounds; N-acyliminocarbonate group-containing compounds; orthocarboxylic acid ester group-containing compounds; compounds containing a group expressed by the formula

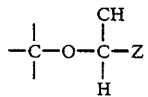

in which Z is defined later; polymeric compounds of aromatic 1,2-dialdehyde; polymeric compounds having tert-butyl/carboxylic acid ester groups at the side chains thereof; polymeric compounds having tert-butyl/phenol carbonate groups at the side chains thereof; and the like.

Specific examples of these compounds are given below, but the present invention is not limited to the use of such compounds.

Silylether group-containing compounds are compounds having at least one silylether group, which is decomposable by an acid and expressed by the formula (I):

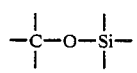

Suitable examples of such silylether compounds are described in Japanese patent application (OPI) Nos. 37549/1985, 121446/1985, and U.S. patent application Ser. No. 807,937 filed Dec. 12, 1985 and Japanese patent application (OPI) No. 151643/1986. Above all, highly sensitive are silylether compounds having hydrophilic groups as described in U.S. patent application Ser. No. 625,079, filed June 27, 1984, in which the hydrophilic groups are exemplified by the following:

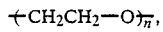

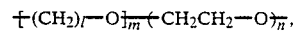

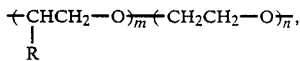

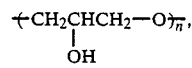

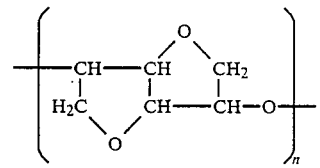

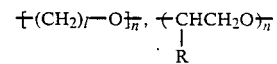

in which l is an integer of from 1 to 4, m and n are integers of 1 or more, preferably integers of from 1 to 100 and most preferably integers of from 1 to 20, and R is an alkyl group or phenyl group which may be substituted. A particularly suitable hydrophilic group is $(CH_2CH_2-O)_n$.

Acetal group- or ketal group-containing compounds to be used in the present invention are compounds containing acetal or ketal groups which are acid-decomposable and can be expressed by the following general formula (II):

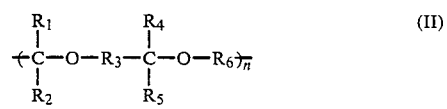

in which n denotes an integer of from 1 to 40; $R_1$ and $R_4$ denote hydrogen atom, alkyl group or aryl group; $R_3$ and $R_6$ denote alkyleneoxy group; $R_2$ and $R_5$ denote alkyl group or aryl group. Two of $R_1$, $R_2$ and $R_3$ and two of $R_4$, $R_5$ and $R_6$ may be combined to form a substituted or non-substituted ring. Otherwise, $R_3$ and $R_6$ denote alkylene group while $R_2$ and $R_5$ denote alkoxy group which may form substituted or non-substituted ring with $R_3$ or $R_6$. $R_3$ may combine to $R_4$ and $R_1$ may combine to $R_6$ of the adjacent repeating unit, to form a substituted or non-substituted ring, respectively.

Examples of such compounds are found in German Pat. No. 2,718,254, U.S. Pat. No. 4,247,611, British Pat. No. 1,602,902, Belgian Pat. No. 866,309 and Japanese patent application (OPI) No. 133429/1978, where there are described compounds containing acetal or ketal groups at the polymer chains thereof, which can be exemplified by the following compounds:

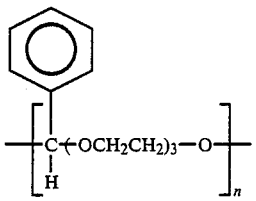

Enolether group-containing compounds to be used in the present invention are compounds containing at least one enolether group which is acid-decomposable and can be expressed by the following general formula (III):

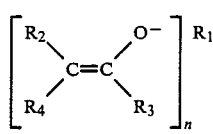

(III)

in which $R_1$ is aliphatic group having at least two carbon atoms with valence of n; $R_2$, $R_3$ and $R_4$ are the same or different and each denotes hydrogen atom, alkyl group or aryl group, or otherwise, two of $R_2$, $R_3$ and $R_4$ are combined to each other to form a saturated or olefinically unsaturated ring; and n is an integer of from 1 to 4.

Examples of such compounds are found in German patent application (OLS) No. 2,829,511, U.S. Pat. No. 4,248,957, European Pat. No. 6627, and Japanese patent application (OPI) No. 12995/1980, where there are described compounds containing enoether at the polymer chain thereof, which can be exemplified by the following compounds:

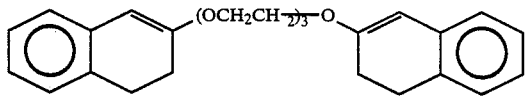

N-acyliminocarbonate group-containing compounds to be used in the present invention are compounds containing at least one N-acyliminocarbonate group which is acid-decomposable and can be expressed by the following general formula (IV):

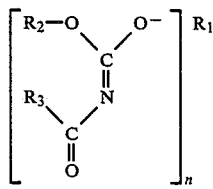

(IV)

in which $R_1$ indicates aliphatic group, cycloaliphatic group or aromatic group with valence of n, $R_2$ and $R_3$ indicate alkyl group or aryl group where two of $R_1$, $R_2$ and $R_3$ may be combined to each other to form heterocyclic ring, and n indicates an integer of from 1 to 3.

Suitable examples of such compounds are found in German patent application (OLS) No. 2,829,512, U.S. Pat. No. 4,250,247, European Pat. No. 6626 and Japanese patent application (OPI) No. 126236/1980, where there are described N-acyliminocarbonate group-containing compounds which can be exemplified by the following compounds:

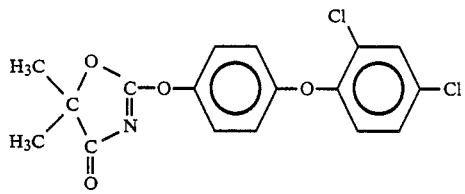

Orthocarboxylic acid ester group-containing compounds to be used in the present invention are compounds containing a group which is acid-decomposable and is expressed by the following general formula (V):

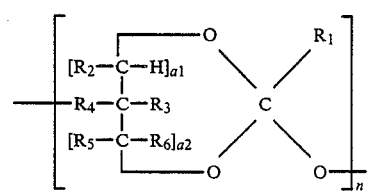

(V)

in which $R_1$ donotes hydrogen atom, alkyl group, cycloalkyl group or aryl group; $R_2$, $R_3$ and $R_5$ are the same or different and denote hydrogen atom, alkyl group or aryl group; $R_4$ denotes alkylene group where the alkylene group may be interrupted through a hetero-atom, an unsaturated group or a cyclic group, or $R_4$ denotes alkyleneoxy group when $a_1 = a_2 = 1$; $R_6$ denotes hydrogen atom or methyl group; $a_1$ and $a_2$ are 0, 1 or 2 where $a_1 + a_2$ is 1 or 2; and n is an integer of from 3 to 200.

Examples of such compounds are found in German patent application (OLS) No. 2,928,636, U.S. Pat. No. 4,311,782, European Pat. No. 22,571, and Japanese patent application (OPI) No. 17345/1981, where there are described orthocarboxylic acid ester group-containing compounds which can be exemplified by the following formula:

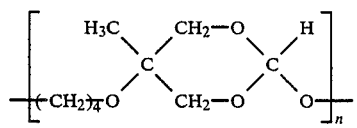

in which n is an integer of from 5 to 100.

As acid-decomposable group-containing compounds to be used in the present invention, there are also included water-insoluble organic compounds containing one or more groups as defined in the following general formula (VI):

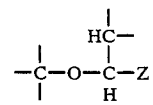

(VI)

in which Z is selected from the group consisting of —OAr, —NRSO$_2$Ar,

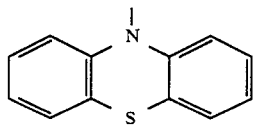 and

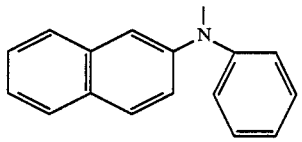

where Ar is monovalent or divalent aromatic group and R is lower alkyl group.

Examples of such compounds are found in U.S. Pat. No. 224,918 and Japanese Patent Publication No. 36442/1977, where these are described compounds containing

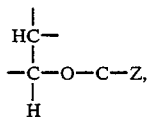

which can be exemplified by the following compounds;

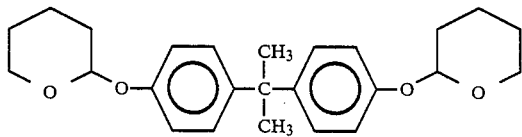

Polymeric compounds of aromatic 1,2-dialdehydes to be used in the present invention are compounds containing acid-decomposable groups, which can be expressed by the following general formula (VII):

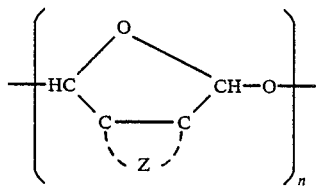

(VII)

in which n is an integer and Z is orthoaromatic group, preferably orthophenyl group. Examples of such compounds are polymeric compounds as described in U.S. Pat. No. 3,984,253, where Z is examplified by O-phenylene, 1,2-naphtylene, 2,3-naphtylene, 4-methyl-1,2-phenylene, 4-chloro-1,2-phenylene, 4,5-dimethyl-1,2-phenylene and the like.

As further examples of polymeric compounds of 1,2-dialdehydes to be used in the present invention, there can be included those containing acid-decomposable groups, which can be expressed by the following general formula (VIII):

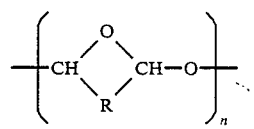

(VIII)

in which n is an integer and R denotes five-membered or six-membered ring having an aromatic group at ortho- or para-position thereof. Concrete examples of such polymeric compounds are found, in U.S. Pat. No. 3,984,253 which discloses the compounds of the formula (VII).

As compounds having acid-decomposable groups to be used in the present invention, there are included polymeric compounds (polyvinyl compounds) having acid-decomposable branched groups at the side chains thereof as described in U.S. Pat. No. 410,201 or Japanese patent application (OPI) No. 45439/1983, where the preferred side-chain group is exemplified by tert-butyl/carboxylic acid ester and tert-butyl/phenol carbonate. The most preferred compounds include poly(p-tert-butoxycarbonyloxy-α-methylstyrene), poly(p-tert-butoxycarbonyloxystyrene), poly(tert-butyl-p-vinylbenzoate), poly(tert-butyl-p-isopropenylphenyloxyacetate), and poly(tert-butyl-methacrylate).

A compound having an acid-decomposable group, as described above, should be used in an amount of from 10 to 40% by weight, preferably in the range of from 15 to 30% by weight, of the total composition. The addition in an amount of lower than 10% by weight will result in no formation of image, while the addition in an amount exceeding 40% by weight is not desirable since the plate will become unstable with the passage of time.

Suitable examples of alkali-soluble resins to be used in the present invention are novolak type resins such as phenol/formaldehyde resins, cresol/formaldehyde resins, p-tert-butylphenol/formaldehyde resins, phenol-modified xylene resins, phenol-modified xylenemesitylene resins or the like, pyrogallol/acetone condensates, homopolymers or copolymers of hydroxystyrene, homopolymers or copolymers of polyhalogenated hydroxystyrene, copolymers of (meth)acrylic acid and another type of vinyl compound (e.g. methyl methacrylate), copolymers of crotonic acid, copolymers of itaconic acid including partially esterified polymers thereof and the like. These alkali-soluble resins may be used alone or in combination. Such alkali-soluble resin is to be used in an amount of from 60 to 90% by weight, preferably from 70 to 85% by weight, of the total composition.

If necessary, the photo-solubilized composition (i.e. the composition which will become soluble upon irradiation with actinic rays), to be used in the present invention may contain dyes such as anthraquinone dyes, e.g. C.I. Solvent orange 6, C.I. Solvent red 143, C.I. Solvent red 145, C.I. Solvent blue 36, C.I. Solvent blue 82 or monoazo/metal complex based dyes; pigments such as C.I. Pigment red 48, C.I. Pigment blue 15; fillers such as silica powder, polyethylene powder, polyfluoroethylene powder, calcium carbonate powder, barium sulfate powder or the like; plasticizers; cyclic acid anhydride for improvement of sensitivity, such as phthalic anhydride, tetrahydro phthalic anhydride, maleic anhydride, succinic anhydride, and the like; and agents for increasing the production efficiency of the acid from the above-mentioned acid-producing compounds (i.e. so-called sensitizing agents), and other additives.

The photo-solubilized composition to be used in the present invention is dissolved in a solvent and coated onto a substrate. Examples of suitable solvents are ethylene dichloride, cyclohexane, methyl ethyl ketone, ethyleneglycol monomethyl ether, ethyleneglycol monoethyl ether, 2-methoxyethyl acetate, toluene, ethylacetate or the like. These solvents may be used alone or in combination. The concentration of the components (the total solids including the additives) is in the range of from 2 to 50% by weight, where the concearation of the solid components (a)+(b)+(c) is preferably in the range of from 0.1 to 25% by weight. The amount of the coating is generally, as solids, in the range of from 0.1 to 5.0 g/m², preferably in the range of from 0.5 to 3.0 g/m², in the case of preparing a presensitized plate for a lithographic printing plate. A smaller quantity of coating will increase the light-sensitivity of a resultant plate, but will degrade the physical properties of the light-sensitive coating.

As the substrate to be used in preparing an image-bearing plate, particularly a lithographic printing plate, with the photo-solubilized composition, there are included aluminum plates, the surfaces of which have been rendered hydrophilic through a suitable treatment such as silicate-treatment, anodization, graining, or silicate-electrolytic-deposition; zinc plates; stainless steel plates; chromate treated steels; and plastic films or paper sheets which have been rendered hydrophilic.

Examples of the source of the actinic rays to be used in the practice of the present invention include a mercury lamp, a metal halide lamp, a xenon lamp, a chemical lamp, a carbon arc lamp and the like. The exposure can also be done with highly dense-energy beams, such as laser beams or electronic rays. Such laser beam can be exemplified by helium/neon laser, argon laser, krypton-ion laser, and helium/cadmium laser.

Suitable developers for the photo-solubilized composition to be used in the present invention are aqueous solutions of inorganic alkalis, such as sodium silicate, potassium silicate, sodium hydroxide, potassium hydroxide, lithium hydroxide, sodium triphosphate, sodium diphosphate, ammonium triphosphate, ammonium diphosphate, sodium metasilicate, sodium hydrogencarbonate, and ammonia water. A suitable developer concentration can range from 0.1 to 10% by weight, preferably 0.5 to 5% by weight. If necessary, such as aqueous alkaline solution may contain a surfactant and/or an organic solvent (e.g. an alcohol).

The present invention will be illustrated in greater detail with reference to the following examples, which are not for limiting the scope of the invention. All % are by weight as otherwise indicated.

EXAMPLE 1

A 2S aluminum plate having the thickness of 0.24 mm was immersed in a 10% aqueous sodium tertiaryphosphate solution kept at 80° C. for 3 minutes for degreasing, followed by a graining treatment with a nylon-brush. The plate was then subjected to an etching with an aqueous sodium aluminate solution for about ten seconds and a desmutting treatment with a 3% aqueous solution of sodium hydrogen sulfate. The resultant aluminum plate was anodized in 20% sulfuric acid under a current density of 2 A/dm² for 2 minutes to obtain an aluminum plate as substrate.

A presensitized plate (A) was prepared by coating a light-sensitive composition (A), as shown below, onto the anodized aluminum plate, followed by drying for two minutes at 100° C. The amount of coating was 2.0 g/m² after drying.

| Light-sensitive Composition (A): | |
|---|---|
| Silylether compound* as described in Japanese Patent Appln. (OPI) No. 121446/1985 | 0.30 g |
| Cresol/formaldehyde novolak resin | 1.0 g |
| 2-(p-methoxyphenyl)-4,6-trichloromethyl-s-triazine | 0.05 g |
| Dye | 0.01 g |
| Ethylene dichloride | 10 g |
| Methylcellosolve acetate | 10 g |

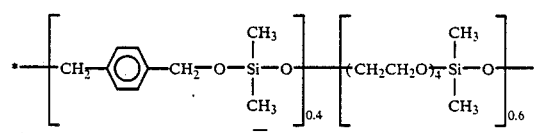

Number average molecular weight $\overline{Mn} = 1730$

An exposure operation was conducted with a high-voltage mercury lamp (10 ampere) placed at the distance of 70 cm for three second while a step tablet having 0.15 density difference was contacted with the light-sensitive layer of the presensitized plate (A).

The exposed plate was cut into ten pieces, five of which was developed directly after the exposure, i.e. 1, 5, 10, 30 and 60 minutes after the exposure, respectively. The other five plate pieces were immersed in water kept at 30° C. for 30 seconds (0.5, 4.5, 9.5, 29.5 and 59.5 minutes after the exposure, respectively), immediately followed by development. The development was carried out by immersing each plate piece for 60 seconds in a developing solution comprising ten-fold diluted DP-3 (a trade name of a developer from Fuji Photo Film Co., Ltd. of Japan).

The step number of the step tablet which was completely cleared was determined for each plate piece. The results are summarized in Table 1.

TABLE 1

| Interval between exposure and development (minutes) | Step number | |
|---|---|---|
| | Without hot-water treatment (Comparative) | Hot-water treatment (The present invention) |
| 1 | 1 | 5 |
| 5 | 2.5 | 5 |
| 10 | 4 | 4.5 |
| 30 | 4.5 | 4.5 |
| 60 | 5 | 4.5 |

The results demonstrate that, without the hot-water treatment, sensitivity becomes higher as the interval between the exposure and the development becomes longer so that it takes long to reach a desired steady sensitivity. On the other hand, if the hot-water treatment is practiced according to the present invention, there can be obtained a substantially constant sensitivity regardless of the interval between the exposure and the development. As can be seen from the table, it is preferable to conduct the hot-water treatment within about 10 minutes after the exposure, followed by a development, for obtaining a high sensitivity.

EXAMPLE 2

The same presensitized plate as used in Example 1 was subjected to an exposure operation in the same way as in Example 1. Plate pieces from the plate were immersed in water kept at 30° C. for periods of time as shown in Table 2, followed by development, where the intervals between the exposure and the development was 5 minutes for all the plate pieces. The sensitivity of each plate piece was determined using the step tablet in the same manner as in Example 1. The results are shown in Table 2.

TABLE 2

| Immersion time | Step number |
| --- | --- |
| 0 (second) | 2.5 |
| 10 (seconds) | 3.5 |
| 20 (seconds) | 4 |
| 30 (seconds) | 5 |
| 1 (minute) | 5.5 |
| 2 (minutes) | 5.5 |
| 3 (minutes) | 5.5 |

The results demonstrate that there can be obtained a substantially constant high sensitivity when the immersion in the hot-water is carried out for 30 seconds or longer.

EXAMPLE 3

The same presensitized plate as used in Example 1 was subjected to an exposure operation as in Example 1. Plate pieces from the plate were immersed for 30 seconds in hot water of the temperatures as shown in Table 3, 4.5 minutes after the exposure, followed by development, where the intervals between the exposure and the development were 5 minutes for all the plate pieces. The sensitivity of each plate piece was determined using the step tablet in the same manner as in Example 1. The results are given in Table 3.

TABLE 3

| Water temperature | Step number |
| --- | --- |
| 10° C. | 3 |
| 20° C. | 4 |
| 30° C. | 5 |
| 40° C. | 4.5 |
| 50° C. | 4.5 |
| Without the hot-water treatment | 2.5 |

It is demonstrated that the suitable temperature of water for the treatment is 30° C. or higher.

Thus, according to the method of the present invention, it is always possible to achieve a high sensitivity regardless of the interval between an exposure and a development, without causing the problem of latent-image sensitization.

What is claimed is:

1. A process for preparing an image-bearing plate which comprises the steps of: imagewise exposing a light-sensitive plate comprising a substrate having provided thereon a light-sensitive layer comprising (a) 0.01 to 10% by weight of a compound capable of producing an acid upon irradiation with actinic rays, (b) 10 to 40% by weight of a compound having at least one acid-decomposable group wherein the product formed by the reaction between said acid and said compound has a solubility, in a developing solution, higher than that of said compound having the acid-decomposable group, and (c) 60 to 90% by weight of an alkali-soluble resin; treating the exposed light-sensitive plate with hot water of 30° C. to 50° C. for a period of at least 10 seconds, and removing the exposed area with an aqueous alkali solution from the plate, wherein said compound having at least one acid-decomposable group is selected from the group consisting of silylether group-containing compounds; acetal or ketal group-containing compounds; enolether group-containing compounds; N-acyliminocarbonate group-containing compounds; orthocarboxylic acid ester group-containing compounds; compounds containing a group expressed by the formula:

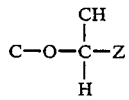

in which Z is selected from the group consisting of —OAr, —NRSO$_2$Ar,

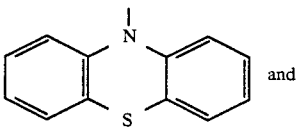 and

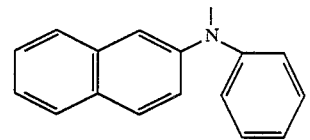

where Ar is monovalent or divalent aromatic group and R is lower alkyl group; and polymeric compounds of aromatic 1,2-dialdehyde.

2. The process according to claim 1, wherein the treatment with hot water is conducted within about one hour after the exposure.

3. The process according to claim 2, wherein the treatment with hot water is conducted within ten minutes after the exposure.

4. The process according to claim 1, wherein the treatment with hot water is conducted for a period of at least 30 seconds.

5. The process according to claim 1, wherein the hot-water treatment is conducted within about ten minutes after the exposure for a period of at least 30 seconds using hot water of from 30° to 50° C.

6. The process according to claim 1, wherein the coverage of the light-sensitive layer is in the range of from 0.1 g/m$^2$ to 5 g/m$^2$.

7. The process according to claim 1, wherein said compound capable of producing an acid upon irradiation with actinic rays is selected from the group consisting of salts of diazonium, phosphonium, sulfonium and iodonium with BF$_4^-$, PF$_6^-$, SbF$_6^-$, SiF$_6^{--}$, and ClO$_4^-$, trihalomethyl-S-triazines, and trihalomethyloxadiazoles.

8. The process according to claim 1, wherein said alkali-soluble resin is selected from the group consisting of phenol/formaldehyde resins, cresol/formaldehyde resins, p-tert-butylphenol/formaldehyde resins, phenol-modified xylene resins and phenol-modified xylenemesitylene resins.

9. The process according to claim 5, wherein the hot-water treatment is conducted for a period of 30 to 120 seconds.

* * * * *